(12) United States Patent
Zhang et al.

(10) Patent No.: US 8,314,395 B2
(45) Date of Patent: Nov. 20, 2012

(54) SEMICONDUCTOR CRYSTAL BASED RADIATION DETECTOR AND METHOD OF PRODUCING THE SAME

(75) Inventors: Minglong Zhang, Shanghai (CN); Yanfeng Du, Niskayuna, NY (US); John Eric Tkaczyk, Niskayuna, NY (US); Zhaoping Wu, Shanghai (CN); Ira Blevis, Zicron Yaakov (IL)

(73) Assignee: General Electric Company, Niskayuna, NY (US)

( * ) Notice: Subject to any disclaimer, the term of this patent is extended or adjusted under 35 U.S.C. 154(b) by 532 days.

(21) Appl. No.: 12/550,921

(22) Filed: Aug. 31, 2009

(65) Prior Publication Data
US 2011/0049376 A1 Mar. 3, 2011

(51) Int. Cl.
*G01T 1/24* (2006.01)
(52) U.S. Cl. .......... 250/370.08; 250/370.12; 250/370.13
(58) Field of Classification Search ............. 250/370.13, 250/370.08, 370.12
See application file for complete search history.

(56) References Cited

U.S. PATENT DOCUMENTS

| | | | |
|---|---|---|---|
| 5,933,706 A | 8/1999 | James et al. | |
| 6,080,997 A | 6/2000 | Tashiro et al. | |
| 7,001,849 B2 | 2/2006 | Wright et al. | |
| 2003/0121885 A1 | 7/2003 | Wright et al. | |
| 2007/0194243 A1* | 8/2007 | Chen et al. | 250/370.13 |
| 2007/0290142 A1* | 12/2007 | Du et al. | 250/370.09 |
| 2008/0203514 A1 | 8/2008 | Szeles | |

FOREIGN PATENT DOCUMENTS

WO WO2007024302 3/2007

OTHER PUBLICATIONS

Search Report and Written Opinion from corresponding PCT Application No. PCT/US2010/044231 dated Nov. 23, 2011.
Schlesinger et al., "Cadmium zinc telluride and its use as a nuclear radiation detector material", Materials Science and Engineering R: Reports, vol. No. 32, No. 4-5, pp. 103-189, Apr. 2, 2001.
Xiaoqin et al., "Surface passivation of CdZnTe wafers", Materials Science in Semiconductor Processing, volume No. 8, No. 6, pp. 615-621, Jan. 1, 2005.
Park et al., "Surface Passivation Effect on CZT-Metal Contact", IEEE Transactions on Nuclear Science, volume No. 55, No. 3, pp. 1547-1550, Jun. 1, 2008.

* cited by examiner

*Primary Examiner* — David Porta
*Assistant Examiner* — Casey Bryant
(74) *Attorney, Agent, or Firm* — Marie-Claire Maple

(57) ABSTRACT

A radiation detector includes a semiconductor crystal having a first surface and a second surface opposite to the first surface, a first electrode electrically coupled with the first surface of the semiconductor crystal to allow current to flow between the first electrode and the crystal, and an insulating layer on the first surface and between the semiconductor crystal and the first electrode so as to create a partially transmissive electrical barrier between the first electrode and the crystal. The insulating layer has a thickness ranging from about 50 nanometers to about 500 nanometers.

14 Claims, 4 Drawing Sheets

SEMICONDUCTOR CRYSTAL BASED RADIATION DETECTOR AND METHOD OF PRODUCING THE SAME

BACKGROUND

Embodiments of the invention are generally related to the field of radiation detectors, and more particularly, to a semiconductor crystal based radiation detector and a method of producing the detector.

Semiconductor crystal based radiation detectors are used for detecting ionizing radiation due to their ability to operate at room temperature, their small size and durability, and other features inherent in semiconductor crystals. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation such as gamma or X-rays.

The semiconductor crystal based radiation detectors generally employ semiconductor materials, such as Cd—Zn—Te (CZT) which has a wide band-gap. A conventional CZT radiation detector typically comprises a CZT crystal located between a first and a second electrode. A bias voltage is formed across the electrodes by, for example, applying an external voltage from an external voltage source to at least one of the first and second electrodes. The bias voltage results in an electric field distribution in the radiation detector. One of the electrodes is a read-out electrode and is generally referred to as an anode electrode, and the other electrode is a cathode electrode.

Electron and hole pairs generated within the semiconductor crystal by an ionizing radiation adsorbed within the semiconductor crystal are separated, drift toward and collected by the anode and the cathode electrodes at external biases, respectively. These moving electron and holes create pulse signals in an external signal processing circuitry.

If all electrons and holes generated by the ionizing radiation are collected by the cathode and anode electrodes respectively, the output charge signal will exactly equal to the changes from the energy of the ionizing radiation deposited within the crystal. Because the deposited charge is directly proportional to the energy of the ionizing radiation, the semiconductor radiation detector provides a measurement of the energy of the ionizing radiation.

However, performance of the radiation detectors is typically limited by leakage currents which reduce the ability of the radiation detector to resolve the ionizing radiation. Accordingly, it is desirable to have an improved radiation detector with reduced leakage current, and a method of producing the radiation detector.

BRIEF DESCRIPTION

In accordance with an embodiment disclosed herein, a radiation detector includes a semiconductor crystal having a first surface and a second surface opposite to the first surface, a first electrode electrically coupled with the first surface of the semiconductor crystal to allow current to flow between the first electrode and the crystal, and an insulating layer on the first surface and between the semiconductor crystal and the first electrode so as to create a partially transmissive electrical barrier between the first electrode and the crystal. The insulating layer has a thickness ranging from about 50 nanometers to about 500 nanometers.

In accordance with another embodiment disclosed herein, a method of producing a radiation detector is provided. The method includes etching one surface of a semiconductor crystal block to form a gradient tellurium-rich layer on the semiconductor crystal block which comprises cadmium and tellurium, oxidizing the gradient tellurium-rich layer to form a tellurium-oxidation layer, and forming an electrode on the tellurium-oxidation layer. The etching step comprises contacting a portion of the semiconductor crystal block with a solution includes bromine, methanol, lactic acid, and ethylene glycol.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
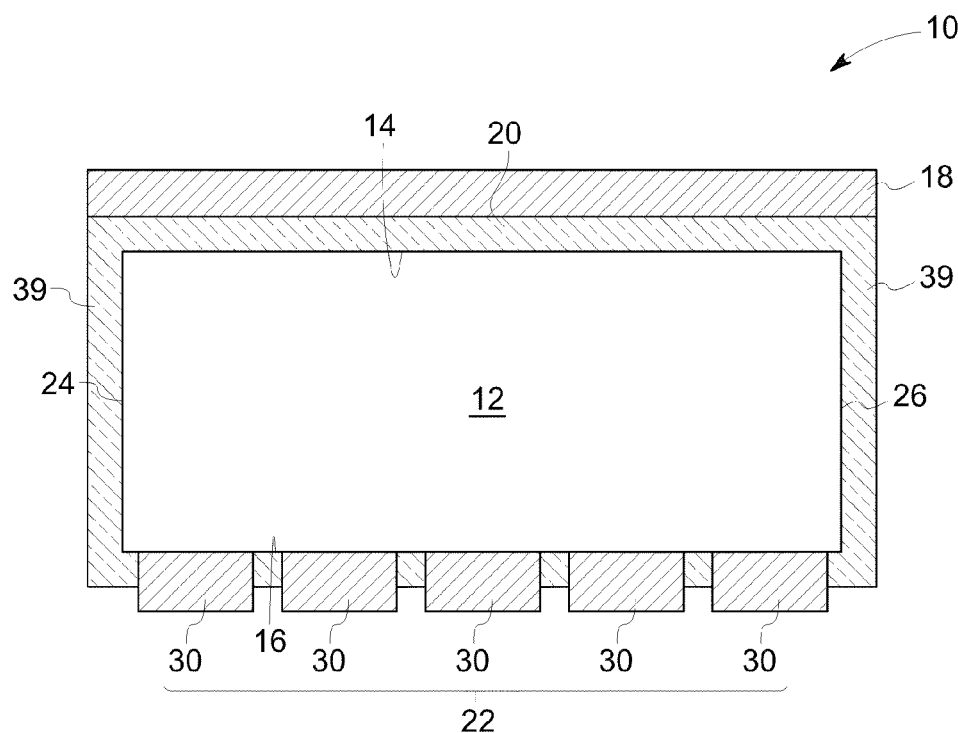
FIG. 1 is a cross-sectional view of a semiconductor crystal based radiation detector according to one embodiment of the invention.

Embodiments disclosed herein relate to a semiconductor crystal based radiation detector. The radiation detector comprises an insulating layer between a semiconductor crystal and an electrode, for reducing leakage current of the radiation detector. Embodiments disclosed herein related to a method of producing a radiation detector. The method comprises an etching process to form a gradient tellurium-rich layer on a semiconductor crystal block. Embodiments of the invention are discussed below with reference to the drawing figures. For purposes of simplicity of description, common elements across different embodiments share the same reference numbers.

Referring to FIG. 1, an exemplary radiation detector 10 comprises a semiconductor crystal 12 having a first surface 14 and a second surface 16 opposite to the first surface 14. A first electrode 18 is electrically coupled with one of the first and second surfaces 14, 16 of the semiconductor crystal 12 to allow current to flow between the first electrode 18 and the semiconductor crystal 12. An insulating layer 20 is formed on the first or second surface 14, 16 and between the semiconductor crystal 12 and the first electrode 18 so as to create a partially transmissive electrical barrier between the first electrode 18 and the semiconductor crystal 12. A second electrode 22 electrically couples with the other of the first and second surfaces 14, 16 of the semiconductor crystal 12.

In the illustrated embodiment, the semiconductor crystal 12 is configured into a planar block having the first and second surfaces 14, 16 opposite to each other, and side-wall surfaces 24, 26 between the first and second surfaces 14, 16. Side-wall surfaces of crystal comprises four surfaces exception of first and second surfaces. The semiconductor crystal 12 comprises cadmium and tellurium, and embodiments of the semiconductor crystal 12 may comprise CdTe, Cd—Zn—Te or Cd—Mn—Te. In one specific embodiment, the semiconductor crystal 12 comprises $Cd_xZn_{1-x}Te$, wherein "x" ranges from 0.6 to 1. In another specific embodiment, x=0.9.

One of the first and second electrodes 18, 22 (e.g., in the illustrated embodiment, second electrode 22) is a read-out electrode and is referred to as an "anode electrode", and the other of the first and second electrodes 18, 22 (e.g., in the illustrated embodiment, first electrode 18), is referred to as a "cathode electrode". In the illustrated embodiment, a bias voltage (V) is applied to the cathode and anode electrodes 18, 22. The bias voltage is formed, for example, by connecting the anode electrode 22 to ground, and connecting the cathode electrode 18 to an external voltage source (not shown). The biasing voltage (V) results in an electric field (E) distributed within the radiation detector 10, which is a ratio of the bias voltage to a thickness of the radiation detector 10. In certain embodiments of the invention, the electric field (E) ranges from 100 to 20000 Volt/centimeters (V/cm), 300 to 3000 V/cm, or 1000 to 3000 V/cm. In certain embodiments, the cathode electrode 18 comprises a conductive material such as platinum (Pt), gold (Au), indium (In), nickel (Ni), aluminum (Al), or Indium Tin Oxides (ITO) with a thickness ranging from 10 to 1000 nanometers.

In certain embodiments, the anode electrode 22 comprises a plurality of read-out pixels 30 physically disconnected from each other. The read-out pixels 30 may be arranged to form one or more rows, columns, or grids. In other embodiments, the anode electrode 22 may comprise only one read-out pixel. In the illustrated embodiment, the anode electrode 22 includes an active area configured to detect photons which is dynamically adjustable based upon an incident flux rate on the anode electrode. "Flux rate" herein refers to counts per second per unit area. In other words, the active area of the anode electrode 22 may be adjusted during the operation of the detector 10. In certain embodiments, the active area may be decreased for high flux rates, and increased for low flux rates.

Figure 2:
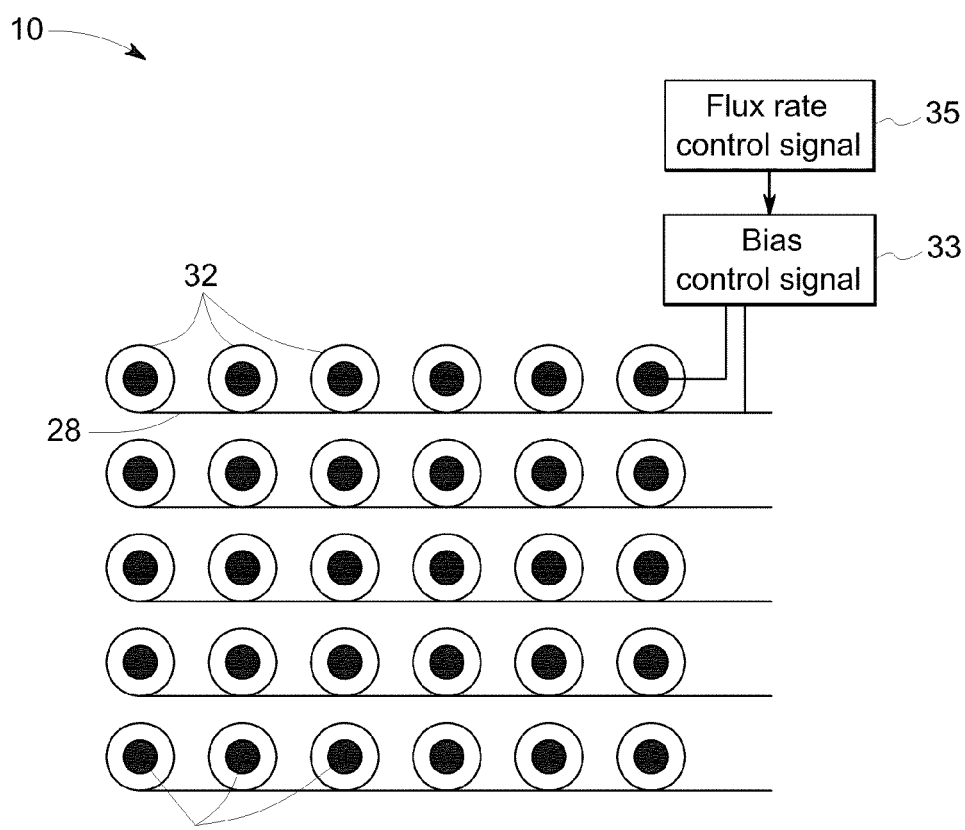
FIG. 2 is a top view of an exemplary anode electrode comprising arrays of read-out pixels and bias control portions.

FIG. 2 is a top view of an exemplary anode electrode 22. As shown in the illustrated embodiment of FIG. 2, the anode electrode 22 comprises at least one bias control portion 32 adjacent to the read-out pixels 30. In the illustrated embodiment, the bias control portions 32 of each row are electrically coupled to each other via a common bus 28. During operation of the radiation detector 10, the bias control portions 32 and the read-out pixels 30 may be coupled to a bias control circuit 33. The bias control circuit 33 receives a flux rate control signal 35 and adjusts the active area of the anode electrode 22 by varying the voltage on the bias control portions 32 relative to the voltage of the central read-out pixels 30. At a low flux rate, the bias of the bias control portion 32 is made more negative than the read-out pixel 30 in order to push the electrons to the read-out pixel 30. As the flux rate is increased, the bias on the bias control portion 32 is made closer to ground or made more positive than the read-out pixels 30 so as to collect some fraction of the electrons and to shrink the active area of the anode electrode 22. Different configurations of the bias control portion 32 and the read-out pixels 30 may be of types described and illustrated in commonly assigned US Patent Publication No. 2007/0290142, the disclosure of which is incorporated herein by reference.

In certain embodiments of the invention, the read-out pixels 30 and the biasing control electrodes 32 comprise the same material, whereas in other embodiments, the read-out pixels 30 and the biasing control portions 32 may comprise different materials. In one embodiment, the semiconductor crystal 12 is a P-type semiconductive crystal and comprises CdTe. In one embodiment, the read-out pixel 30 may comprise indium or aluminum, and the bias control portions 32 may comprise a noble metal material, such as gold or platinum. In another embodiment, the semiconductor crystal 12 is a N-type semiconductive crystal and comprises Cd—Zn—Te, the read-out pixels 30 comprise noble metal materials, such as gold or platinum, and the bias control portions 32 comprise indium, or aluminum for example.

Referring back to FIG. 1, in the illustrated embodiment, the insulating layer 20 is located between the semiconductor crystal 12 and the first electrode (cathode electrode) 18. In one embodiment, the insulating layer 20 comprises tellurium, oxygen and cadmium. In one embodiment, the concentration of tellurium and the concentration of oxygen in the insulating layer 20 increase in a direction from the crystal 12 toward the first electrode 18, and the concentration of cadmium decreases in the direction from the crystal 12 toward the cathode electrode 18. In another embodiment, the insulating layer 20 comprises a deposited insulator comprising aluminum oxide or silicon nitride. In certain embodiments, a thickness of the insulating layer 20 ranges from about 50 nanometers to about 500 nanometers. In one embodiment, the thickness of the insulating layer 20 ranges from about 100 nanometers to about 200 nanometers. In one specific embodiment, the thickness of the insulating layer 20 ranges from 140 nanometers to 170 nanometers. Accordingly, electrons are prevented from injecting into the detector by this barrier layer and holes are allowed transmit and be collected by electrode by tunneling effect. In one embodiment, the radiation detector 10 comprises insulating layers 39 deposited on side-wall surfaces 24, 26 of the semiconductor crystal 12. The insulating layers 39 may have the same material as the insulating layer 20.

Figure 3:
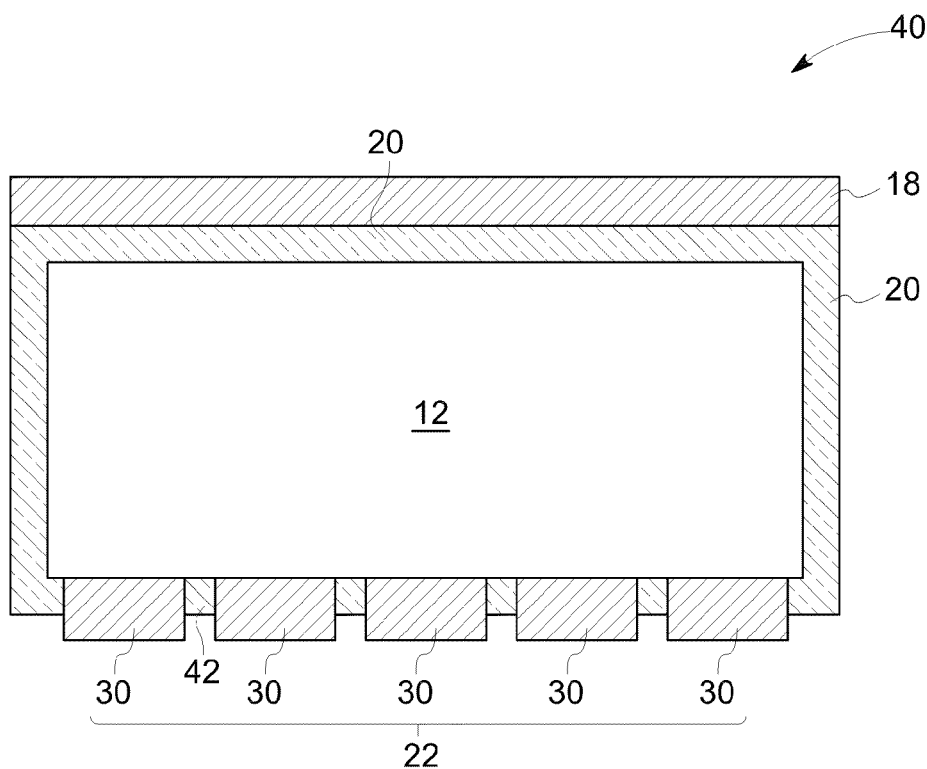
FIG. 3 is a cross-sectional view of a semiconductor crystal based radiation detector according to another embodiment of the invention.

FIG. 3 illustrates a radiation detector in accordance with another embodiment. Referring to FIG. 3, a radiation detector 40 comprises an insulating layer 20 between the cathode electrode 18 and semiconductor crystal 12, and an insulating layer 42 between the anode electrode 22 and the semiconductive electrode 12.

In accordance with embodiments of the invention, the radiation detectors 10, 40 comprising the described insulating layers have been shown to have reduced leakage currents comparing with conventional radiation detectors. A comparison of leakage current characteristics of three example detector configurations is shown in Table 1. In Table 1, example 1 represents a conventional radiation detector, whereas examples 2 and 3 represent radiation detectors comprising insulating layers between the cathode and the semiconductor crystal as is described with reference to FIG. 1. Examples 2 and 3 further represent detectors that comprise different cathode and anode electrodes materials.

TABLE 1

|  | Example 1 | Example 2 | Example 3 |
| --- | --- | --- | --- |
| thickness of insulating layer (nanometers) | 0 | 160 | 160 |
| semiconductor crystal material | $Cd_{0.9}Zn_{0.1}Te$ | $Cd_{0.9}Zn_{0.1}Te$ | $Cd_{0.9}Zn_{0.1}Te$ |
| cathode electrode material | Indium | Indium | Gold |
| anode electrode material | Indium | Indium | Gold |
| biasing voltage (volt) | −600 | −600 | −600 |
| average leakage current ($-nA/mm^2$) | 10 | 0.03 | 0.02 |
| Full Width at Half Maximum (keV) or energy resolution for 122 keV Co57 source | 7.5 | 4.3 | 4.2 |

As is demonstrated by the results illustrated in Table 1, the conventional radiation detector (Example 1) has an average leakage current of −10 $nA/mm^2$. Example 2 comprises the same semiconductor material, the same biasing voltage and the same cathode and anode electrode materials as that of Example 1, but has an average leakage current of −0.03 $nA/mm^2$ which is greatly reduced as compared with Example 1. Further, as is shown by the comparison of examples 2 and 3, leakage current reduction is largely influenced by the insulating layers 20, but does not change much due to the use of different electrode materials.

As is further demonstrated in Table 1, examples 2 and 3 have much improved energy resolution compared with example 1. "Energy resolution" herein refers to the ability of radiation detectors to distinguish energy rays having similar energy levels, and is evaluated by Full Width at Half Maximum (FWHM) method. A smaller FWHM value represents that the radiation detector has a higher detection resolution. The FWHM value in Table 1 was measured by a RENA-3 readout system provided by NOVA R&D, Inc and 122 keV Co-57 source. The data is based on raw spectrums without any calibration or correction, and the electronic noise of the system is about 3.6 KeV.

Figure 4:
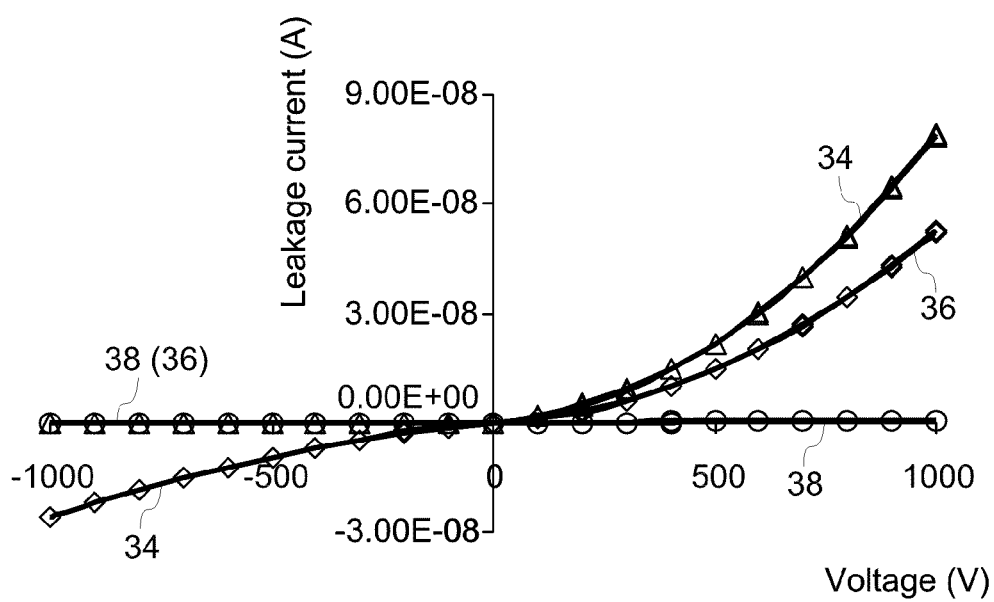
FIG. 4 is a diagram illustrating leakage currents of three radiation detector examples respectively under difference biasing voltages.
Figure 5:
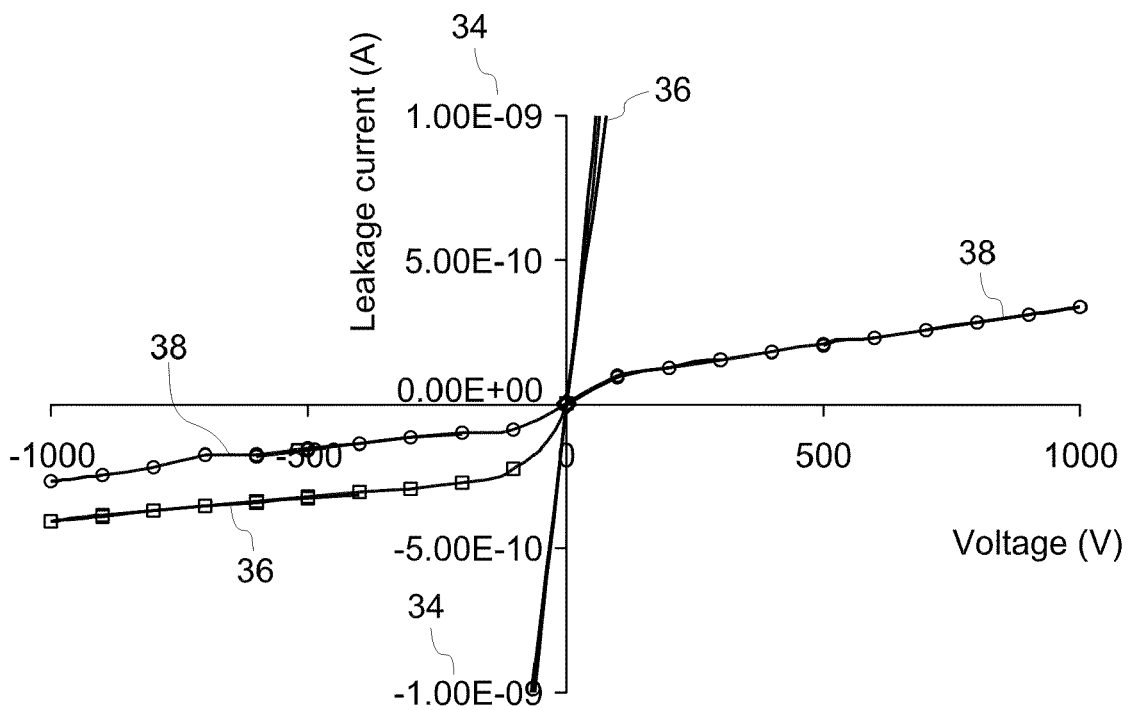
FIG. 5 is a magnified diagram of FIG. 4.

FIG. 4 is a leakage current comparison of the conventional radiation detector (example 1) with examples (example 4, example 5) of the radiation detectors 10, 32 measured under different biasing voltages, whereas curve 34 represents leakage current characteristic of example 1 which is a conventional radiation detector, curve 36 represents leakage current characteristic of one example (example 4) of the radiation detector 10 comprising an insulating layer between the cathode electrode 18 and the semiconductor crystal as is illustrated in FIG. 1, and curve 38 represents leakage current characteristic of another example (example 5) of the radiation detector 40 comprising insulating layers between the cathode electrode and the semiconductor crystal, and between the anode electrode and the semiconductor crystal as is illustrated in FIG. 3. As is illustrated, comparing with example 1, example 4 has much lower leakage current at negative biasing voltages, for example, when the anode electrode is connected to ground, and the cathode electrode is energized with an electrical potential lower than zero. While, example 5 has much lower leakage current at both negative and positive biasing voltages. FIG. 5 is the same comparison but with a magnified vertical axis as compared to FIG. 4, for better illustration of the leakage currents of examples 4 and 5.

Figure 6:
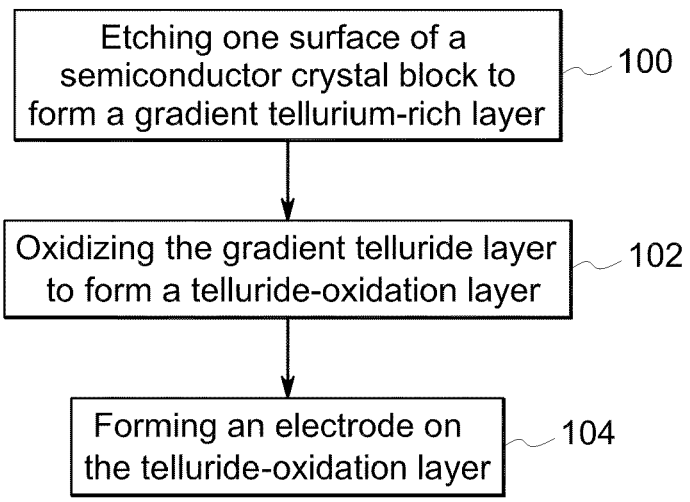
FIG. 6 is an exemplary process of a producing a semiconductor crystal based radiation detector.

FIG. 6 illustrates an exemplary method for producing a radiation detector. Referring to FIG. 6, the method comprises etching one surface of a semiconductor crystal block to form a gradient tellurium-rich layer at step 100, oxidizing the gradient tellurium-rich layer to form a tellurium-oxidation layer at step 102, and forming an electrode on the tellurium-oxidation layer at step 104. In one embodiment, the semiconductor crystal block comprises cadmium and tellurium. In one specific embodiment, the semiconductor crystal block comprises cadmium, zinc and tellurium. In another specific embodiment, the semiconductor crystal block comprises cadmium, manganese and tellurium.

At step 100, in certain embodiments, a portion of a semiconductor crystal block is contacted with a solution which comprises bromine, methanol, lactic acid, and ethylene glycol, and the portion of the semiconductor crystal block is etched into a tellurium-rich layer. In one embodiment, only one surface of the semiconductor crystal block is contacted with the solution to form one tellurium-rich layer on the semiconductor crystal block. In another embodiment, a first surface and a second surface opposite to the first surface are contacted with the solution to form a first and a second tellurium-rich layer opposite each other. In still another embodiment, the whole semiconductor crystal block is contacted with the solution, and thus the entire outer surface of the semiconductor crystal block is turned into a tellurium-rich layer. In one embodiment, the semiconductor crystal block is immersed in the solution for a time period ranging from 0.5 to 10 minutes, and under a temperature ranging from 18 degrees centigrade to 30 degrees centigrade. In one embodiment, a percentage of bromine in the solution by volume ranges from 1 percent to 5 percent.

Figure 7:
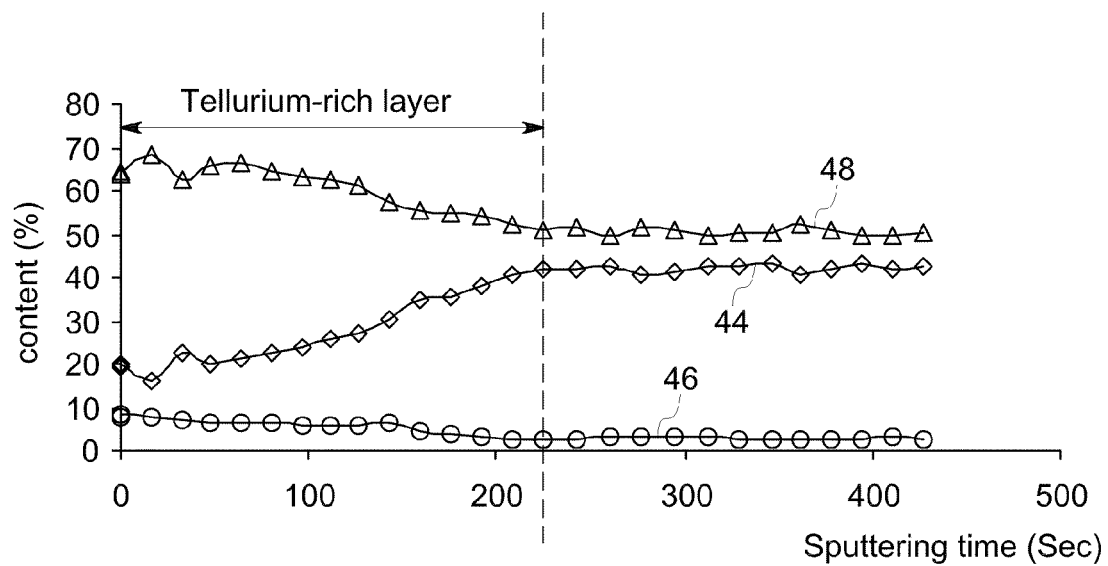
FIG. 7 is a diagram illustrating concentrations of cadmium, zinc and tellurium from an outer surface of a semiconductor crystal block to an inner portion of the semiconductor crystal block using an Auger Electron Spectroscopy (AES) method after an etching process.

In one example, one surface of a $Cd_{0.9}Zn_{0.1}Te$ crystal was immersed into a solution comprising bromine, methanol, lactic acid, and ethylene glycol for five minutes, and under a temperature of 20 degrees centigrade. The ratio of bromine, methanol, lactic acid, and ethylene glycol was about 2:38:20:40. Concentrations of cadmium, zinc and tellurium from an outer surface of the semiconductor crystal block to a inner portion of the semiconductor crystal block was measured using an Auger Electron Spectroscopy (AES) method and is illustrated in FIG. 7 respectively as curves 44, 46, 48. The sputtering times can be calibrated into thicknesses, and is substantially in a linear relationship with thicknesses. As is illustrated, the tellurium-rich layer formed in the example was at about 220 seconds, which is about 160 nanometers after calibration. Concentrations of cadmium, zinc and tellurium change substantially linearly in the tellurium-rich layer and thus the etching process is easy to control.

Figure 8:
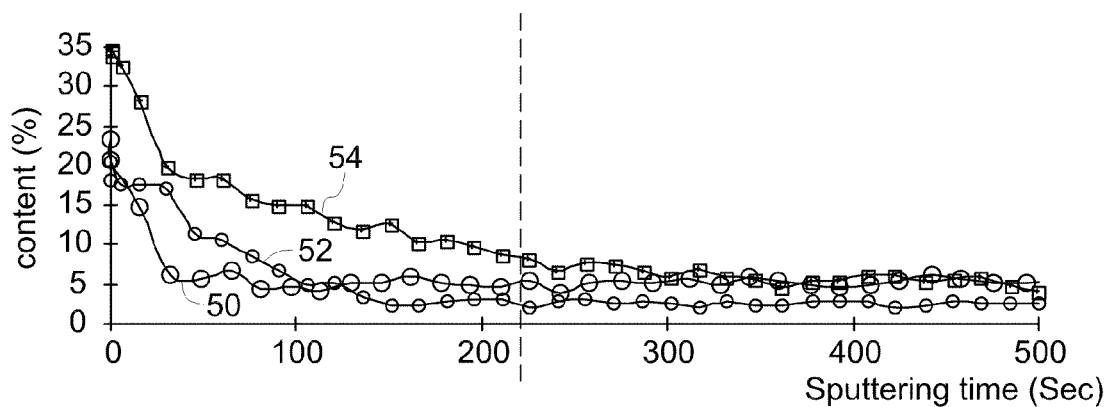
FIG. 8 is a diagram illustrating concentrations of oxygen from an outer surface of a semiconductor crystal block to a center portion of semiconductor crystal blocks using different oxidation processes after the etching process.

At step 102, the tellurium-rich layer is oxidized. In one embodiment, the tellurium-rich layer is contacted with a $H_2O_2$ aqueous solution at a temperature ranging from 40 degrees centigrade to 150 degrees centigrade for a time period ranging from 3 to 30 minutes. Oxygen concentrations of three examples were measured by the AES method and are illustrated in FIG. 8. The three examples were obtained by using different oxidation treatments, and are respectively designated with reference numbers 50, 52, 54 in FIG. 8. The first example was obtained by contacting the tellurium-rich layer of a semiconductor crystal with a solution of 30% $H_2O_2$ aqueous solution for about 30 minutes and under a temperature of about 20 degrees centigrade. The second example was obtained by contacting the tellurium-rich layer of a semiconductor crystal with a 40 ml 30% $H_2O_2$ solution with 0.05 g $K_2Cr_2O_7$ for about 30 minutes and under a temperature of about 20 degrees centigrade. The third example was obtained using an oxygen plasma bombardment method. The semiconductor crystal block was placed in a vacuum chamber with a vacuum pressure of ~3 Pa. Oxygen was filled into the vacuum chamber with a flow rate of 20 $cm^3$/minute (sccm). An electrode was energized with a −1000 volt potential, and is spaced apart form the tellurium-rich layer of the semiconductor block for 100 mm Oxygen molecule was break into oxide ions for oxidizing the tellurium-rich layer driven by the high voltage.

At step 104, a first electrode and a second electrode are formed on the first and second surfaces of the semiconductor crystal through a deposition process, for example.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

The invention claimed is:

1. A radiation detector comprising:
a semiconductor crystal having a first surface and a second surface opposite to the first surface;
a first electrode electrically coupled with the first surface of the semiconductor crystal to allow current to flow between the first electrode and the crystal; and
an insulating layer on the first surface and between the semiconductor crystal and the first electrode so as to create a partially transmissive electrical barrier between the first electrode and the crystal, the insulating layer having a thickness ranging from 50 nanometers to 500 nanometers.

2. The detector of claim 1, wherein the semiconductor crystal comprises cadmium and tellurium.

3. The detector of claim 2, wherein semiconductor crystal comprises cadmium zinc tellurium, or cadmium manganese tellurium.

4. The detector of claim 3, wherein insulating layer comprises tellurium, oxygen, and cadmium, and wherein a concentration of tellurium and a concentration of oxygen in the insulating layer increases in a direction from the crystal toward the first electrode, and a concentration of the cadmium decreases in the direction from the crystal toward the first electrode.

5. The detector of claim 1, wherein the insulating layer comprises a deposited insulator comprising aluminum oxide or silicon nitride.

6. The detector of claim 1, wherein a thickness of the insulating layer ranges from 100 nanometers to 200 nanometers.

7. The detector of claim 6, wherein a thickness of the insulating layer ranging from 140 nanometers to 170 nanometers.

8. The detector of claim 1 further comprising a second electrode on the second surface of the semiconductor crystal, and wherein the second electrode comprises a plurality of read-out pixels physically disconnected from each other.

9. The detector of claim 8 further comprising an insulating layer between the second electrode and the semiconductor crystal.

10. The detector of claim 8 further comprising a plurality of bias control portions adjacent to the plurality of read-out pixels.

11. The detector of claim 10, wherein the read-out pixels and the bias control portions comprise different materials.

12. The detector of claim 11, wherein the semiconductor crystal comprises P-type semiconductive material, and wherein the read-out pixels comprise indium or aluminum, and the bias control portions comprises a noble metal.

13. The detector of claim 11, wherein the semiconductor crystal comprises N-type semiconductive material, and wherein the read-out pixels comprise a noble metal, and the bias control portions comprise indium or aluminum.

14. The detector of claim 10 further comprising a bias control circuit to control voltage between the read-out pixels physically disconnected and the bias control portion.

* * * * *